United States Patent
Bear et al.

(10) Patent No.: US 6,697,978 B1
(45) Date of Patent: Feb. 24, 2004

(54) METHOD FOR TESTING OF KNOWN GOOD DIE

(75) Inventors: Michael J. Bear, Centerville, VA (US); Thomas M. Storey, Manassas, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 321 days.

(21) Appl. No.: 09/624,247

(22) Filed: Jul. 24, 2000

Related U.S. Application Data

(60) Provisional application No. 60/161,418, filed on Oct. 25, 1999.

(51) Int. Cl.$^7$ .............................................. G11C 29/00
(52) U.S. Cl. ...................................... 714/718; 714/719
(58) Field of Search .............................. 714/718, 719; 365/8, 200; 324/760

(56) References Cited

U.S. PATENT DOCUMENTS

| | | | | |
|---|---|---|---|---|
| 3,655,959 A | * | 4/1972 | Chernow et al. ............ | 235/153 |
| 4,093,958 A | * | 6/1978 | Riccio, Jr. .................... | 357/68 |
| 5,132,772 A | * | 7/1992 | Fetty ........................... | 357/68 |
| 5,222,066 A | * | 6/1993 | Grula et al. ................. | 371/21.1 |
| 5,241,266 A | * | 8/1993 | Ahmad et al. ............ | 324/158 R |
| 5,361,232 A | * | 11/1994 | Petschauer et al. ......... | 365/201 |
| 5,519,333 A | * | 5/1996 | Righter ....................... | 324/765 |
| 5,570,317 A | * | 10/1996 | Rosen et al. ................ | 365/200 |
| 5,654,588 A | * | 8/1997 | Dasse et al. ................ | 257/754 |
| 5,949,242 A | * | 9/1999 | Wood et al. ................ | 324/760 |
| 6,067,262 A | * | 5/2000 | Irrinki et al. ............... | 365/201 |
| 6,167,541 A | * | 12/2000 | Siek et al. ................... | 714/719 |
| 6,175,244 B1 | * | 1/2001 | Gattiker et al. ............. | 324/765 |
| 6,208,567 B1 | * | 3/2001 | Yamauchi et al. .......... | 365/200 |

OTHER PUBLICATIONS

Mike Sandor, "Guidelines for Insuring Known–Good–Die (KGD) in JPL Space Flight Hardware", (D–16389), Mar. 15, 1999, Jet Propulsion Laboratory.

Alan W. Righter et al., "CMOS IC Reliability Indicators and Burn–In–Economics", 1998 International Test Conference, Paper 8.3, pp. 194–203.

Timothy R. Henry et al., "Burn–In Elimination of a High Volume Microprocessor Using $I_{DDQ}$", 1996 International Test Conference, Paper 9.1, pp. 242–249.

Terry Barrette, et al., "Evaluation of Early Failure Screening Methods", 1996 IEEE, pp. 14–17.

Kenneth Wallquist, "On the Effect of $I_{SSQ}$ Testing in Reducing Early Failure Rate, 1995 International Test Conference", Paper 38.3, pp. 910–915.

You Kondoh, et al. "Universal Membrance Probe for Known Good Die, MCM 1994 Proceedings", pp. 248–254.

Manoj Sachdev, "Deep Sub–micron $I_{DDQ}$ Testing: Issues and Solutions", 1997 IEEE, pp. 271–278.

(List continued on next page.)

Primary Examiner—Phung M. Chung
Assistant Examiner—Dipakkumar Gandhi
(74) Attorney, Agent, or Firm—Snider & Associates; Ronald R. Snider

(57) ABSTRACT

Multi-pattern data retention testing and iterative change of measurement testing are used for the production of Known Good Dies. Multi-pattern data testing of a memory such as an SRAM comprises writing at $V_{dd}$, reduction of $V_{dd}$, restoration of $V_{dd}$, reading of the memory, and comparison of write patterns to read patterns to determine accuracy of data retention. Iterative or change of measurement testing involves repeated testing of a die to determine changes in Iddq, changes in multi-pattern data retention, or other changes in chip operating parameters. Defect activating test may be used in combination with change of measurement testing or with multi-pattern data retention testing.

12 Claims, 12 Drawing Sheets

OTHER PUBLICATIONS

W. Burdick, et al., "High Yield Multichip Modules Based on Minimal IC Pretest", 1994 International Test Conference, Paper 2.3, pp. 30–40.

Yasuhiko Yamamoto, et al., "Evaluation of New Micron–Connection System Using Microbumps", ISRM 93 Proceedings, pp. 370–378.

Steven D. McEuen, "Reliability Benefits of $I_{DDQ}$", *Journal of Electronic Testing: Theory & Application*, 1992, Boston, MA: Kluwer Academic Publishers, pp 41–49.

Roger Perry, "$I_{DDQ}$ Testing in CMOS Digital ASIC's—Putting it all Together", 1992 International Test Conference, Paper 6.1, pp. 151–157.

R.D. Gitlin, "Modern Receiver Structures For Digital Communication", *Recent Technical Developments in Telecommunications*, 1992 Elsevier Science Publishers, pp. 1–93.

Tom Storey, et al., "Stuck Fault and Current Testing Comparison Using CMOS Chip Test", 1991 International Test Conference, Paper 11.3, pp. 311–318.

Alan Suyko, et al., "Development of a Burn–In Time Reduction Algorithm Using the Principles of Acceleration Factors," 1991 IEEE pp. 264–270.

G.H. Bowers, Jr., et al., "'Low Cost Testers' Are They Really Low Cost?", 1984 International Test Conference, Paper 1.4, pp. 40–49.

Thomas W. Williams, "Design for Testability—A Survey", Proceedings of the IEEE, Jan. 1983, vol. 71, No. 1, pp. 98–112.

Mark W. Levi, "CMOS is Most Testable", 1981 IEEE Test Conference, Paper 9.3, pp. 217–220.

\* cited by examiner

METHOD FOR TESTING OF KNOWN GOOD DIE

CROSS REFERENCE TO PROVISIONAL PATENT APPLICATION

This application claims the benefit of the filing date of U.S. Provisional Patent Application No. 60/161,418 filed Oct. 25, 1999, the disclosure of which is incorporated herein by reference.

TECHNICAL FIELD OF THE INVENTION

The present invention relates to the known good integrated circuits, semiconductors in general and, more specifically, to improved Known Good Die (KGD) integrated circuit semiconductor devices which include memory components such as static RAM or dynamic RAM. This invention also relates to logic or application specific integrated circuits (ASIC).

BACKGROUND OF THE INVENTION

Recent improvements to VLSI integrated circuit testing at the wafer level indicate that traditional test methods may not be optimal. Specifically, module level screens, such as time and resource consuming burn-in, temperature cycling, etc., are no longer unique in their ability to identify and eliminate latent defects.

It is well established within the test. industry that a high quality screen at the earliest point of assembly (i.e. wafer test) is typically,.economically optimal. It has been estimated that the cost of identifying and replacing defective die increase ten-fold at each level of packaging. Considering that the test cost alone can represent up to 50% of the product cost, high quality early screening, can represent a major savings. Effective die screening is especially important for Multichip Module (MCM) testing, where the ultimate MCM assembly yield is exponentially proportional to post wafer level test quality level. This fact alone may be why today's MCMs are typically populated with relatively low number of die (2 to 10). When the number of dies exceeds 10, quality levels for individual die must be well above 99% to achieve acceptable MCM yields.

Many screening options are simply not available. during wafer test. These include at-speed test, temperature testing, and testing input/outputs at worst case voltage swings. Additionally, the module level has traditionally been the first level at which reliability-oriented screens such as burn-in can be performed. It is clear that relying on such a screen at the MCM level to first identify an unreliable die poses an unacceptably high risk of unacceptable yields to the MCM manufacturer.

To address this problem, the concept of Known Good Die (KGD) was developed. This was an industry/government initiative to develop test methodologies that allowed bare die to be screened to quality levels equivalent to those quality levels available at the module level. Guidelines for insuring Known-Good-Die (KGD) in JPL Space Flight Hardware published by the Electronics Parts Engineering Office 507, Jet Propulsion Laboratory, California Institute of Technology, Pasadena, Calif. 91109, D-16389, Mar. 15, 1999 describes the concept of KGD and is herein incorporated by reference. KGD's provide the highest reliability and minimum risk levels. Initially the prime method of achieving this goal was to develop temporary die attach methods which permitted module level testing and screening (e.g.) burn-in to be performed prior to die classification. Over time, however, the disadvantage of this mechanical-packaging oriented approach has become evident. It has been proven to be difficult to implement a contacting approach that can maintain a reliable. electrical contact during the rigors of burn-in, and temperature extreme testing, while not damaging the die pad surface (thus reducing the likelihood of defect free bonding during subsequent module assembly). Carriers that are capable of this delicate balance tend to either be prohibitively expensive and/or not sufficiently durable for production manufacturing. Often the cost associated with temporary attachment exceeds the cost associated with simply placing wafer level screened die directly on the MCM.

The state of the art in this area indicates that a goal of wafer-level screening is achievable. First, novel test methods have been developed for CMOS. which have been shown to enhance product reliability. These methods are used to identify defects in dies. These include quiescent current (Iddq) testing, which was originally proposed in 1981. This test method provides improved detection of bridging faults as compared to standard (i.e. stuck fault). test methods and die defects. Subsequent MCM infant mortality is, therefore, reduced. Iddq testing was subsequently shown to reduce burn-in failures by 51%. The Iddq test is used primarily to detect shorts in the circuit. If Iddq exceeds a limit, it is presumed that there are metal or conductor lines that have a short. circuit or a piece of conducting foreign material shorting two lines. If a part should be drawing a nannoamp or a microamp, and it is drawing 100 microamps, the part is obviously defective.

A defect activating stress test method can be the application of an elevated voltage ($V_{dd}$) for a specified period of time, especially when followed by Iddq tests. This approach takes advantage of failure mechanism acceleration factors associated with higher supply voltages. Another defect detecting test method is Very Low Voltage Testing, where tests are conducted at supply voltages close to the transistor threshold voltage. By targeting defects that induce internal voltages that are not full $V_{dd}$ transitions, this methodology has the potential for detecting a variety of subtle malfunctions that could ultimately evolve into failures.

While alternative testing exists, what still remains is to select and implement the correct die test methods, given the specific attributes of the semiconductor. Each semiconductor manufacturing facility's process has its own unique defect densities and potential reliability risks. This is especially true for facilities which fabricate radiation hardened Integrated Circuits (ICs.) because these processes tend to display unique (as compared to commercial ICs) features. Additionally, given the nature of the radiation hardened ICs, high reliability is a paramount concern.

Extending successful Application Specific Integrated Circuit (ASIC) Known Good Die (KGD) approaches to Static Random Access Memories (SRAMs) is not without challenges. For instance, SRAMs display different temperature sensitivities than ASICs. SRAMs are adversely affected by both hot and cold temperatures. Cold temperature testing is not typically possible during a wafer test, because due to condensation, etc., the test chuck can raise the temperature during testing. Reducing the temperature from room temperature is, therefore, not feasible precluding the ability to verify performance under entire operating conditions. Another SRAM specific problem results from the use of redundancy to improve die yields. As standard manufacturing practice, additional memory cells are added to the SRAM. If during testing, defective memory cells are found, these cells are logically disconnected and replaced with these excess cells. These defective cells can continue to elevate the die quiescent current (Iddq) while not affecting functionality. This then complicates Iddq testing, which is an essential element of Known Good Die testing. The presence of analog circuitry within the sense amplifiers, which can elevate the quiescent current of defect-free devices so that the additional contribution of a defect cannot be detected, is also an element unique to memories which must be addressed.

Additionally large capacity static RAM cannot be tested utilizing standard Iddq testing. The reason is that static RAM may include millions of memory cells, each contributing to the sum total of Iddq. Therefore, a short or failure which would elevate the Iddq by 1 to 200 microamps is hot detectable when the defect free Iddq can be in the order of 2 milliamps.

Summary of the Invention

The term multi-pattern data retention test as used in this application refers to placement of a pattern of logical ones and zeros in a device such as a memory or a logic circuit where there are ones and zeros physically adjacent to each other. The pattern may be a checkerboard or checkerboard bar as illustrated in FIGS. 4 and 5 or any other arbitrary pattern. The test preferably uses at least a pattern and its compliment such as checkerboard and checkerboard bar. In its simplest form, the test can be conducted by reading out the information in memory after a predetermined time and comparing the results which will identify cells which leak charge. In another embodiment, a defect detecting test, such as a drop in $V_{dd}$, may be conducted while a pattern is in memory to stress the device prior to reading out the memory. In all cases, memory input and memory output are compared to determine if data is accurately retained in the memory. The test identifies intra-cell leakage by charging adjacent cells to high and low states which allows leakage of charge.

Use of two complimentary patterns provides an opportunity for charge to leak from one cell to an adjacent cell in either direction. This use of two or more patterns increases the reliability of the test results.

In one embodiment of this invention there is provided a method for screening for a Known Good Die comprising conducting a multi-pattern data retention test on a memory located on a die and classifying as a Known Good Die if criteria for the multi-pattern data testing is met. This method further comprises testing of the ability to retain stored data at voltages less then designed operating voltages. One or more test patterns are placed in a memory and the data is read out and compared to the original data to determine if any data has been lost. The multi-pattern data retention test identifies intra-cell leakage.

In another embodiment the multi-pattern data retention test comprises recording patterns of data in a memory, reading out of the data recorded in the memory after a period of time and comparing recorded data and read out data to determine data retention.

In another embodiment the multi-pattern data retention test comprises writing a pattern at $V_{dd}$, lowering $V_{dd}$, restoring to the writing $V_{dd}$, reading the memory, comparing the written pattern to a pattern obtained when reading the memory, determining of data retention and repeating the above procedure for different patterns.

In another embodiment this invention comprises conducting a defect activating test on a functionally good die; conducting a die screening test after conducting the defect activating test; analyzing data from said die screen test to determine changes of measurements; analyzing of changes of measurements to determine if a stability objective is met; classifying as a Known Good Die if a change of measurement stability objective has been met and when the stability objective is not met, returning to the defective activating screen test and repeating each subsequent procedure. A functionally good die is defined as a device which is functioning properly at specified operating voltage ($V_{dd}$), current, and/or temperatures. A functionally good die operates as specified at a specified $V_{dd}$. The defect detecting test may be a high voltage stress test, a thermal cycling test, or a comparison of multi-pattern data retention tests. Defect activation is a test where a latent defect in a die is activated by a condition such as an excessive $V_{dd}$ (overvoltage stress).

In another embodiment a method for screening for a Known Good Die comprises conducting a first multi-pattern data retention test; subjecting the die to a defect activating test; conducting a second multi-pattern data retention test and comparing the results to the first multi-pattern data retention test to determine if defects have been activated; and determining if a multi-pattern data retention test stability objective has been met.

In another embodiment there is a method for screening for a Known Good Die which is dependent upon changes in measurement from test to test. The method comprises conducting a defect activating test on a functionally good die, conducting a screening test after conducting the defect activating test, analyzing data from the die screen test to determine changes of measurement, analyzing of measurements to determine if a stability objective is met and classifying as a Known Good Die if a change of measurement stability objective has been met. In this method high voltage defect activating tests are typically used.

This invention relates to development of wafer level testing that will screen out defective die that would otherwise not be eliminated until the subsequent module (MCM) level screens. Recent improvements in wafer level test methods make such testing possible. It is necessary to perform a defect-oriented analysis of the MCM screens. Rather than deploying a brute force approach of simply subjecting the die to the same screens that would be applied at the module level, defect-oriented analysis concentrates instead on identifying exactly what defects are being identified during these MCM module screens. Once the defect-oriented analysis is established, one can then select and/or develop test methods which target and eliminate dies having specific manufacturing flaws. This produces an equivalent MCM screen by defect-oriented testing at the die level.

This invention detects and screens defects in memory devices, by using the architecture and function of memory circuits and how they differ from logic devices. A many-million SRAM memory device has too much leakage from redundancy implementation and inherent cell leakage. This high background leakage overwhelms any defect-related leakage, rendering Iddq testing useless. This invention replaces Iddq testing in the logic KGD flow (Iddq-high voltage-Iddq) with a multi-pattern data retention test (as seen in FIG. 2).

With this invention, Iddq testing for SRAMs has been discarded and the concept of multi-pattern data retention testing has been used. The multi-pattern data retention allows inspection of each cell for cell leakage and block-to-block leakage, etc. Block-to-block leakage is defined as leakage from one memory area or block to another. A block may have thousands of cells. Still further, the multi-pattern testing will immediately reveal shorts in bit lines or word lines because the pattern will be disrupted. The disruption is especially noticed when an inverse of a pattern or a pattern-bar is used.

This multi-pattern data retention SRAM test is similar to defect detection used for logic Iddq testing (but not to prior art SRAM testing). Multi-pattern data retention testing is the testing of memory device's ability to retain stored data at very low voltages. The memory may be SRAM or Dynamic RAM (DRAM). If a defect is present, then the defect-induced leakage will degrade the stored data signal resulting in loss of data. The technique must be multi-patterned to detect leakage in the "0" and "1" states, cell to cell, block to block, high voltage to low voltage, etc. to detect defective leakage which can be detected by alternate-line biasing. If a conductive defect is across a pair of signal lines, the defect and associated leakage can only be detected if there is a bias across the defect, and the associated line pair.

There are two different ways to conduct a multi-pattern data retention test. One is merely to lower the $V_{dd}$ voltage and determine if it is possible to read and write at the lower voltages. The second way is to write a pattern at normal $V_{dd}$, drop the $V_{dd}$ to a lower level, bring the device back to normal operating voltage, read the memory and determine if the memory has failed to read out all data recorded therein.

Multi-pattern data retention testing uses different patterns which allow various combinations and permutations of charge and no charge (ones and zeros) from cell to cell. This is especially important because if two cells side by side each are charged to $V_{dd}$ volts, there may be no place for the voltage to leak to. There can be no inter-node leakage or inter-line leakage in such a situation. It is for this reason that alternately written cells provide a powerful tool for memory testing.

This multi-pattern memory data retention test overcomes the limitations of standard Iddq testing by ignoring total chip Iddq (leakage) and focusing on the purpose of the memory device. This allows for detailed screening of each memory element and the associated architecture. By combining a multi-pattern data retention test with a defect activation screen, such as high voltage performed on the element, a highly effective Known Good Die screen for memory devices is provided.

A method of providing a higher level of Known Good Die (logic or memory) is to monitor changes of measurements through a series of defect activating tests such as voltage screens or thermal cycling and determine if parametric instabilities exist. Changes of measurements are defined as changes in currents, memory retention or other operating parameters which occur from one test to the next in a series of iterative tests. For example, constantly increasing leakage currents can be a sign of future failures, while an asymptotic behavior may indicate stability. This allows for the activation and detection of more subtle defects not seen during one-pass testing. This produces a more reliable product.

While this invention provides an opportunity to enhance the standard manufacturing test strategy for single chip modules, it can be a major development for Multichip Modules (MCMs). Such improvements can improve-packaging assembly, screening, and second level assembly yields, dramatically reducing costs. Additionally, overall product failure rates can potentially be reduced, thereby improving system and life cycle costs, minimizing program delays and cost associated with component fails late within system integration.

DETAILED DESCRIPTION OF THE PREFERRED EMBODIMENT

Figure 1:
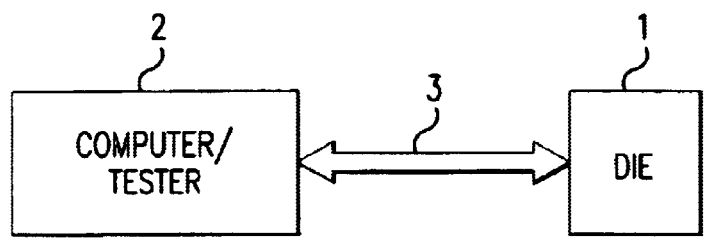
FIG. 1 shows a simplified view of a computer connected to a die by a bus.

This invention uses testing procedures shown in the block diagrams of FIGS. 2, 3, 9, 11, 12 and 13 which are discussed in detail below. The procedures are conducted by connecting a die to a computer as generally depicted in FIG. 1. The die (1) is connected to the computer/tester (2) by a bus (3). The die may be an application specific integrated circuit (ASIC), a SRAM, a logic circuit or any other integrated circuit to which tests in accordance with this invention may be applied. Although use of a computer is preferred for applying voltages and multi-pattern data in a test, other devices, such as voltage meters and recorders may be used.

Figure 2:
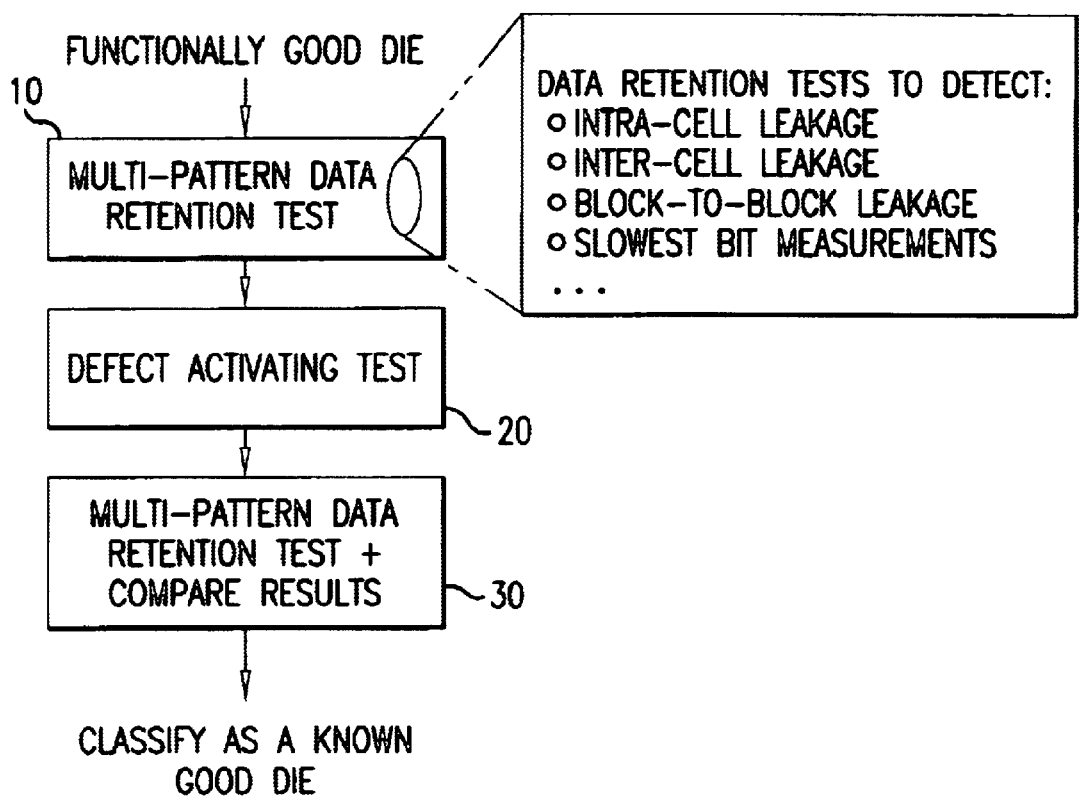
FIG. 2 shows a block diagram showing a first multi-pattern data retention test method.
Figure 3:
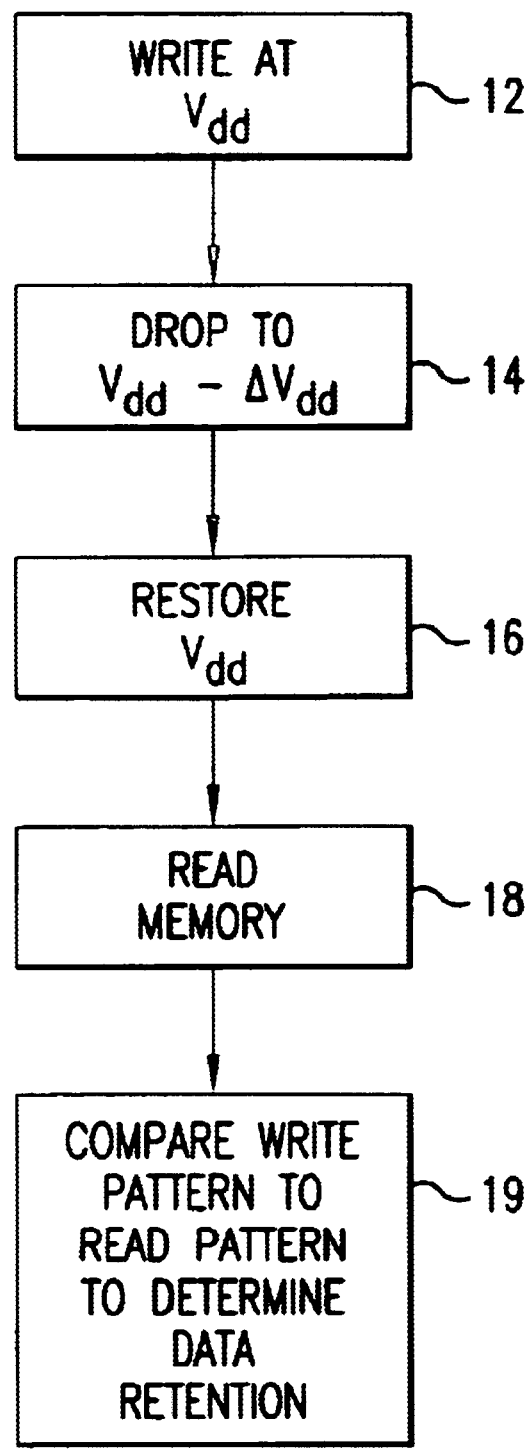
FIG. 3 shows a detailed test procedure for the multi-pattern data retention test where $V_{dd}$ is reduced and then restored to determine memory retention capability.
Figure 9:
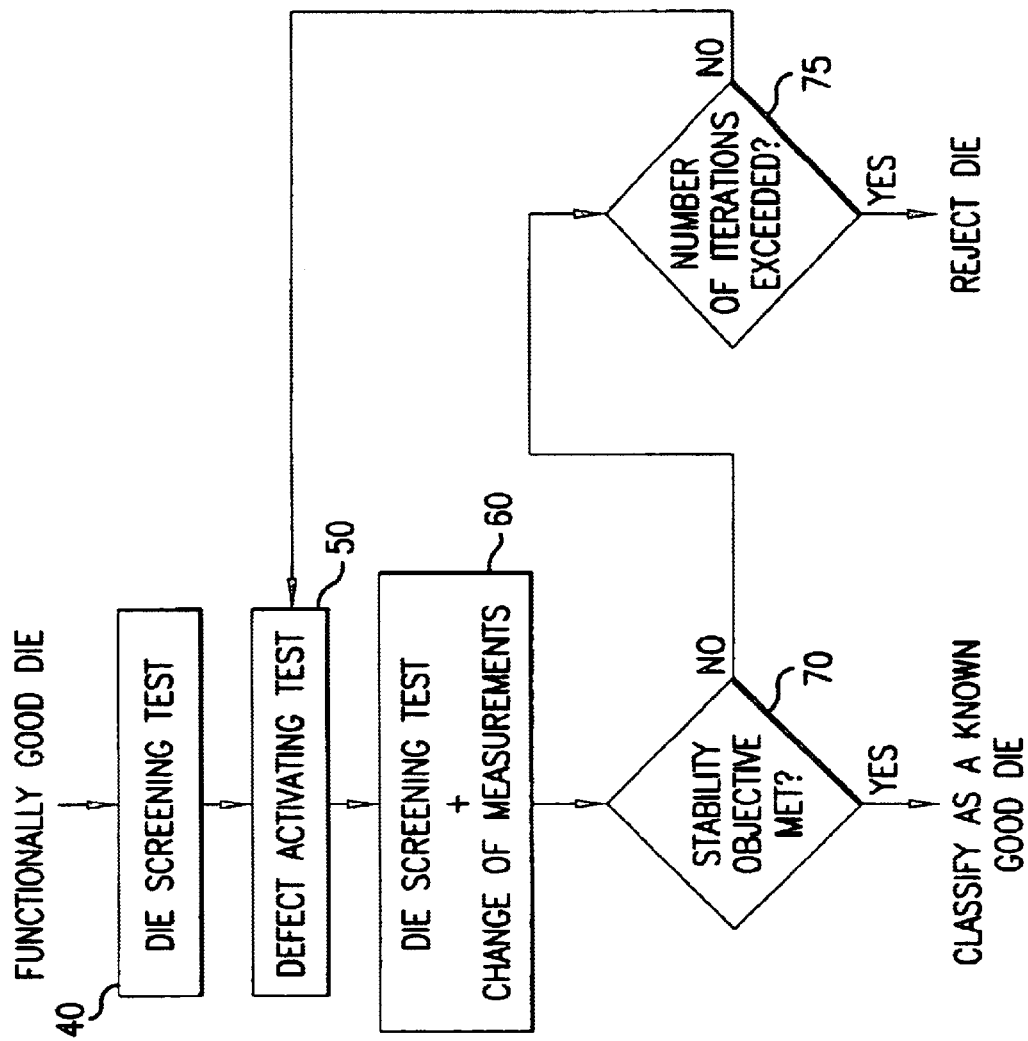
FIG. 9 shows a block diagram of a change of measurements test procedure for use with an Iddq or a defect activating test die screening test.

FIGS. 2 and 3 show a straight forward multi-pattern data retention test of this invention. Iterative or change of measurements testing of a logic or ASIC chip in accordance with the invention is shown in FIG. 9. The die may also be subjected to iterative multi-patterned data retention testing procedures in accordance with the invention which are set forth in FIGS. 11, 12 and 13. The computer programming methods necessary to place information into a memory, analyze memory read-out, to provide test voltages and currents, such as $V_{dd}$ or Iddq and to measure chip response in a single test or iterative change of measurements test are well known in the art. However, the iterative change of measurements tests and multi-pattern data tests as described herein are not known in the art.

In FIG. 2 there is shown a block diagram of the test procedures used to test a memory such as an SRAM using a one-pass multi-pattern data retention test as disclosed in FIG. 3. In this test, the first procedure (12) is writing of test pattern information into the memory at the specified $V_{dd}$. This test pattern information may be any arbitrary pattern of high and low states/voltages (ones and zeros) stored in memory cells. Examples of these patterns are shown in FIGS. 4–8. The next procedure (14) is to drop $V_{dd}$ by a specified amount to a low level $V_{dd}$ to allow inter-cell leakage which is charge leakage from one cell to another cell changing the state of the cell. Next $V_{dd}$ is restored at procedure (16). The restoration of $V_{dd}$ enables the chip and allows normal chip functions such as read out at procedure (18) comparison to originally recorded data is at procedure (19).

The chip is then read out at procedure (18) and the data is transferred back to the computer (2) where it is compared to the initial pattern to determine if the data has been retained in the memory. If there has been charge leakage from one cell to another, data will not be accurately retained.

Figure 14:
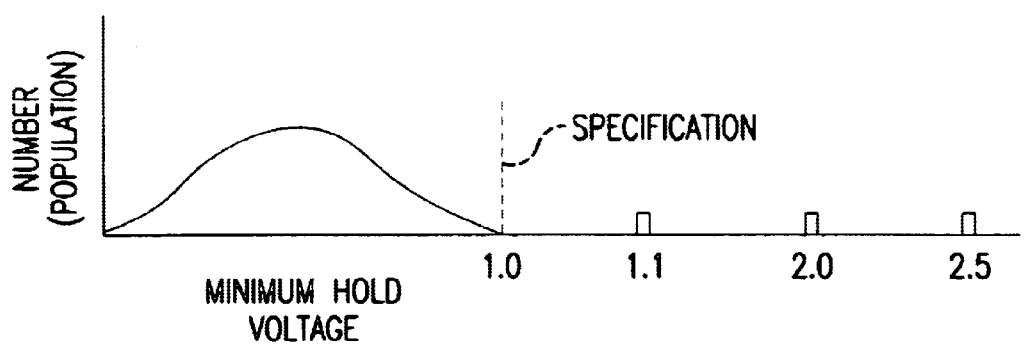
FIG. 14 is a graph of a sample population of dies against the voltage where there is a minimum hold of data.

As shown. in FIG. 3, the reduction in $V_{dd}$ may be a reduction to lower and lower levels. If the SRAM die is a very good die, then the die will retain its charge even at very low voltages because there are essentially no leakage paths that will cause the charge to leak off. In this type of testing, some cells may leak charge at a high $V_{dd}$, and the majority of the population will not leak charge until a very low $V_{dd}$. This is shown in FIG. 14 where a few members of the population are shown to lose charge at high voltages (1.1, 2.0, or 2.5 volts) while the vast majority of the population (those less than 1.0) meet the specification and lose charge only at a level below the specification voltage. In FIG. 14, the horizontal axis is the voltage $V_{dd}$ where data can be held and the vertical axis is the number having a specific $V_{dd}$ hold. The curve of FIG. 14 is a typical population distribution.

A high voltage stress test (20) (a defect activating test) is run with $V_{dd}$ at a high voltage as shown in FIG. 2. This runs the sequence of word lines and bit lines at a test voltage where the logic and functional patterns are run at an elevated voltage. During such testing, all lines at some point are biased alternately. Higher voltage from line to line allows defect detection because there is enough energy to activate the defect, that is, cause the defect to become apparent such as when an aluminum oxide breaks down under high voltage conditions. Typically, if the $V_{dd}$ level is 5 volts, the high voltage test may be at 7.5 or 8 volts which should be sufficient to cause a breakdown of an aluminum oxide of a particle spanning two lines (bit lines or word lines) or activate a defect internal to the device. A subsequent multi-pattern data test may be run at procedure (30) to determine if any defects have been activated by procedure (20).

Figure 4:
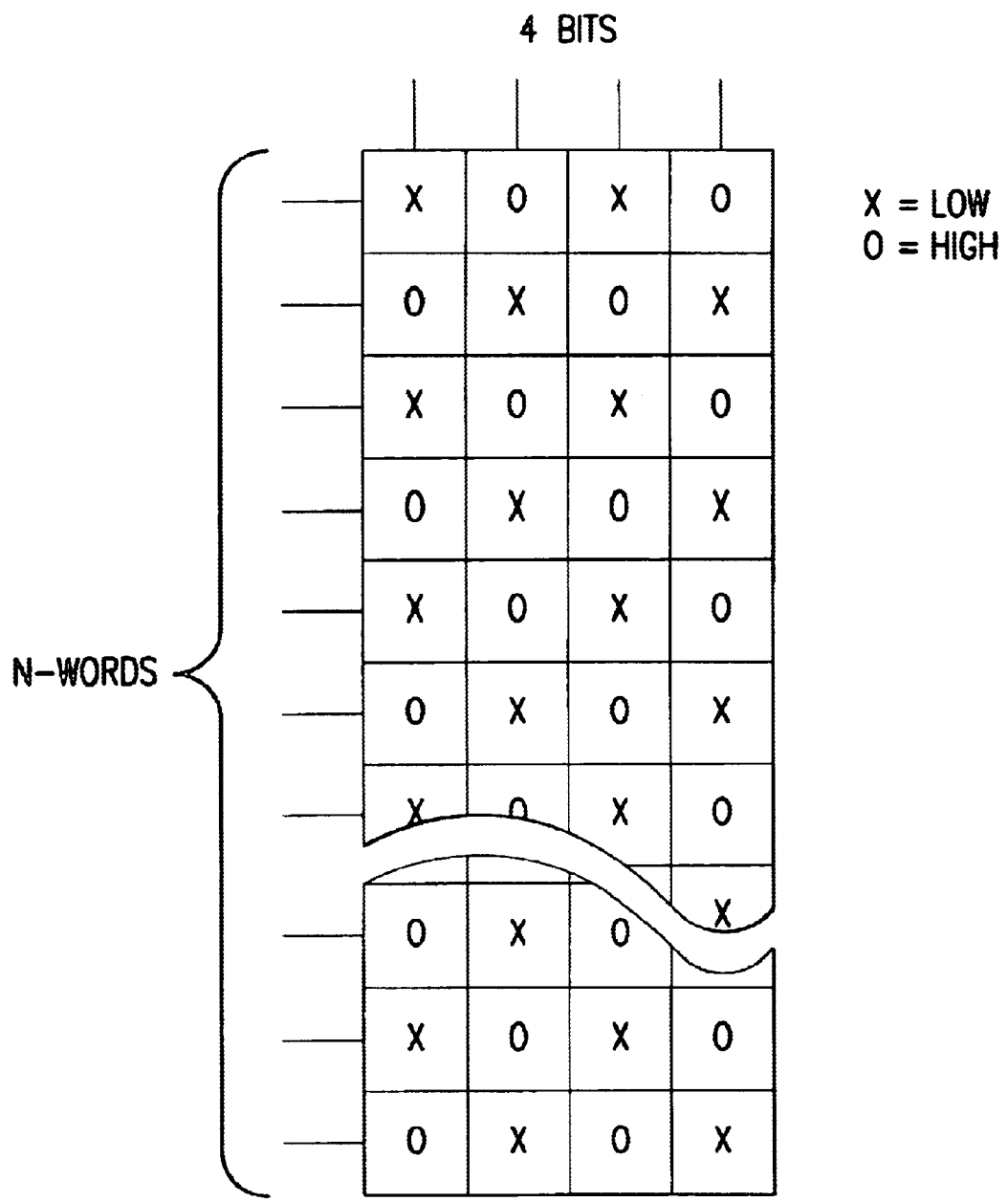
FIG. 4 shows a memory programmed with a checkerboard pattern of high and low levels in its cells.
Figure 5:
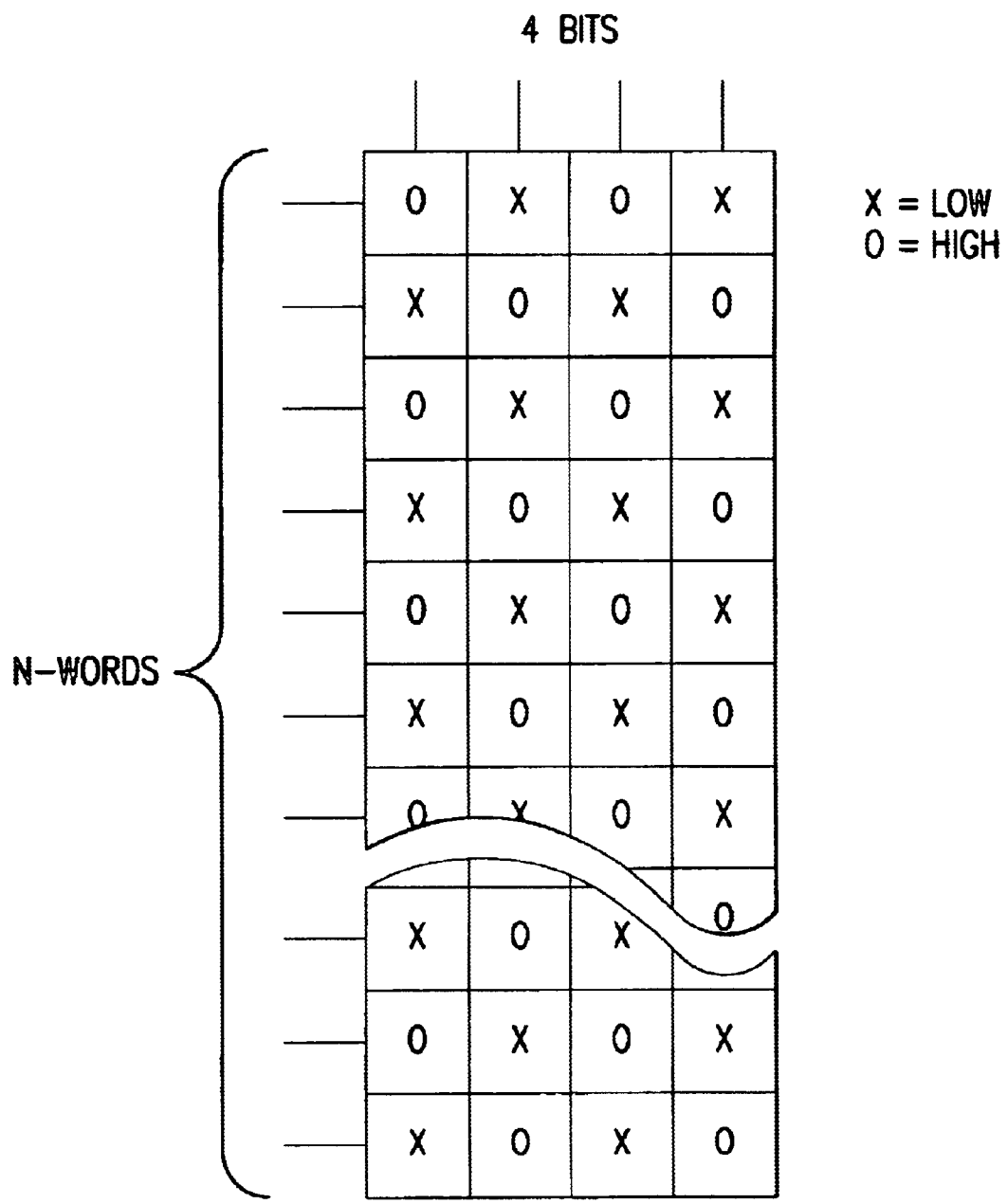
FIG. 5 shows the memory of FIG. 4 with a checkerboard-bar pattern programmed into its cells.
Figure 6:
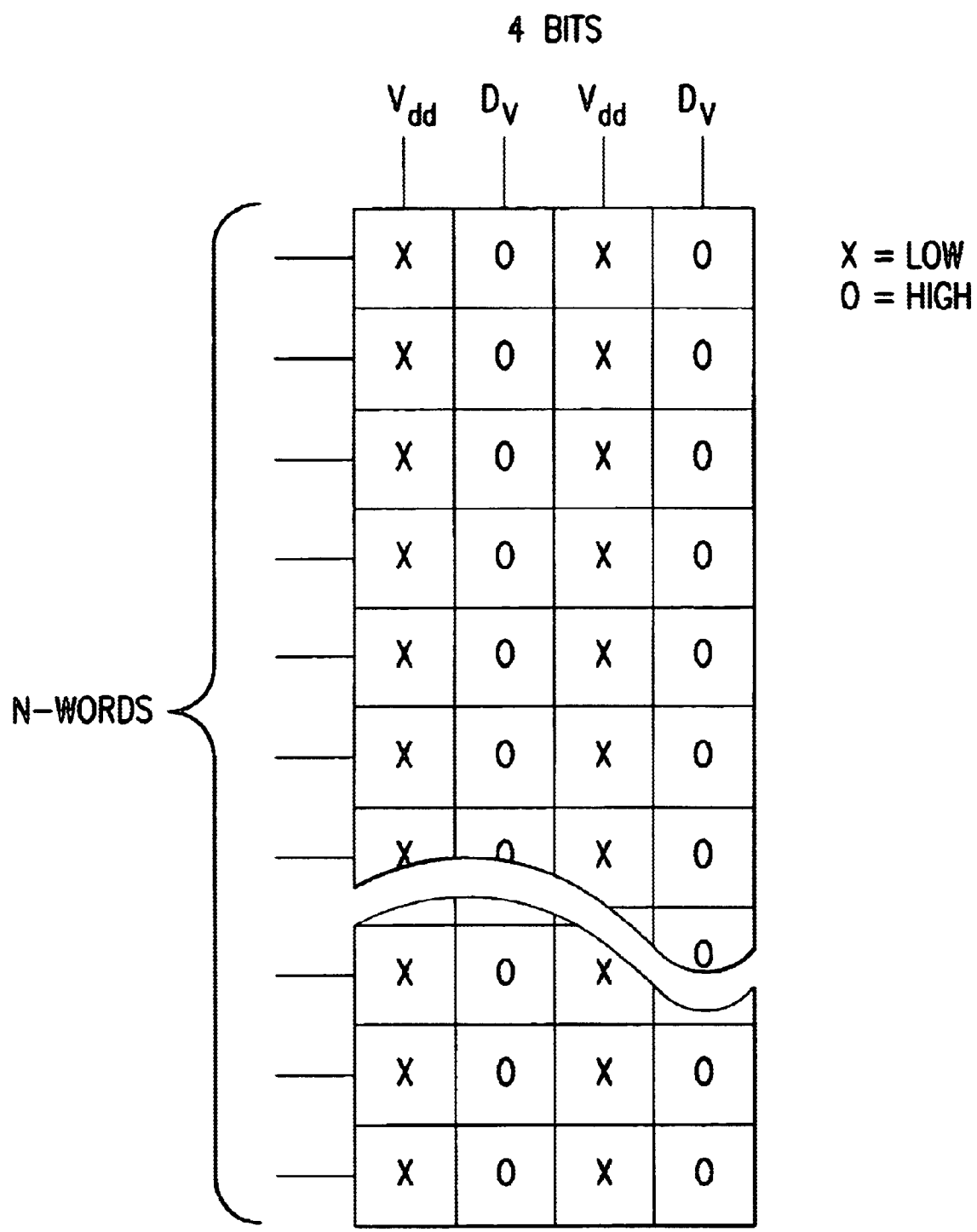
FIG. 6 shows a memory with columns alternately programmed as low and high.
Figure 7:
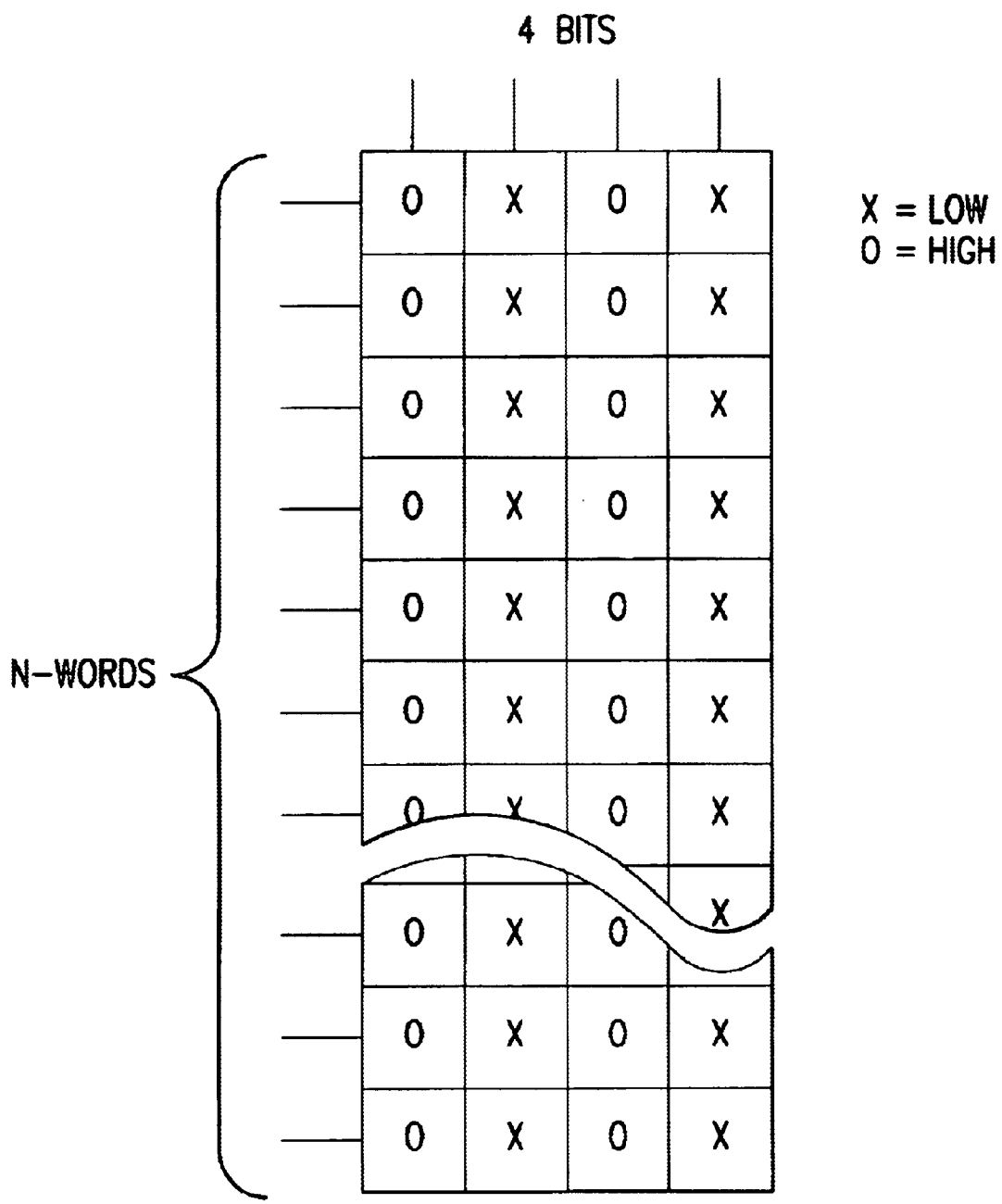
FIG. 7 shows a memory with columns alternately programmed with FIG. 6 low and high-bar.
Figure 8:
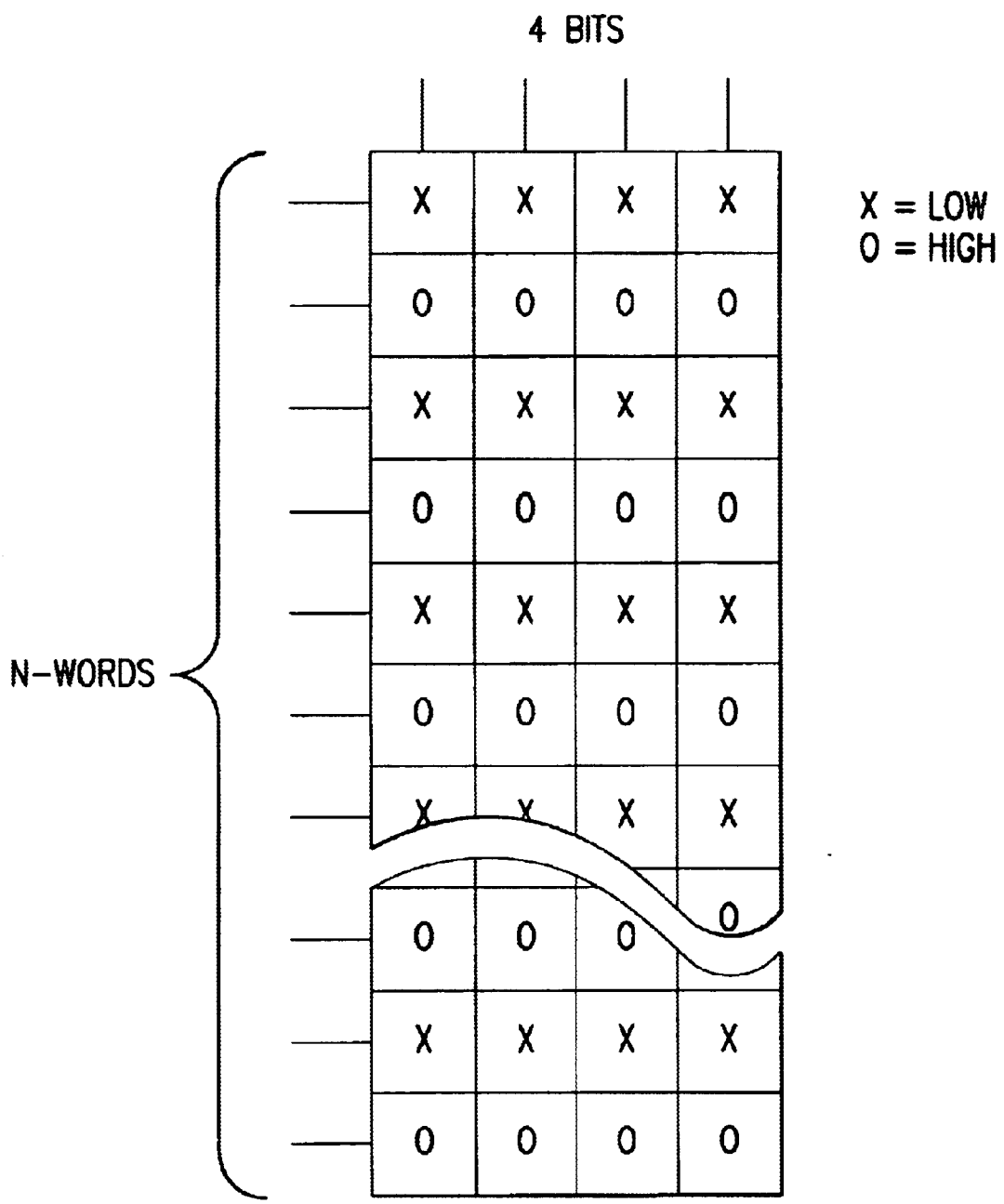
FIG. 8 shows a memory with rows alternately programmed as low and high.

If there is excessive cell to cell leakage, the pattern read out will not be the same as that put into the memory. This is a failure in memory retention which requires die repair or rejection (not classified as a known good die). As noted above, multi-pattern data retention patterns may take any arbitrary form. FIG. 4 shows a "checkerboard" multi-data pattern placed into a memory. "X" indicates low and "0" indicates a high state in each cell. When $V_{dd}$ is lowered, if there is leakage between cells, it can leak between a high cell and a low cell. On the other hand, there will not be leakage from a high cell to a high cell because they are at the same level. To further test a memory, a checkerboard-bar pattern is used as shown in FIG. 5. In the checkerboard-bar pattern, the high and low conditions of all cells are reversed, thereby testing leakage between different cell groups. In FIG. 6 there is shown another pattern which is alternate columns in high and low states, for testing the leakage from different adjacent cells than in the checkerboard patterns, and also testing for shorts between bit lines which would prevent recordation of the desired column data. In FIG. 7 there is shown a column-bar pattern which is the opposite of that shown in FIG. 6. This pattern of FIG. 7 being a complement to the pattern of FIG. 6, allows for testing of leakages and line errors where different cells are in a high or low condition. FIG. 8 shows another configuration where rows are ultimately programmed as high and low. This can test for shorts or problems in the word lines, and test yet another pattern of leakage between high and low cells. Although not shown, a complementary data pattern to FIG. 8 may be used to check cells when they are charged with a row-bar pattern.

FIGS. 4 and 5 are complimentary and FIGS. 6 and 7 are complimentary. Multi-pattern data retention testing is accordance with this invention may include a single pattern test, complimentary patterns or any combination of different patterns.

In testing of lines (bit lines and word lines), alternate lines should either receive $V_{dd}$ volts or 0 volts. In this way, if there is a short between bit lines, it can be easily detected as the data read back is not the data the computer/tester 2 has applied to the device. Similarly, shorting of word lines is detected by alternate $V_{dd}$ and 0 on the lines. If $V_{dd}$ is shorted to ground, the data retention for that word will be incorrect.

As the voltage in procedure (14) of FIG. 3 is reduced (that is changes of measurement in $V_{dd}$ are increased), the voltage across the cells becomes lower and lower, thereby making the test more severe. FIG. 14 demonstrates a case where voltage across the SRAM is tested at various levels in accordance with the procedures set forth in FIG. 3. As shown in FIG. 14, it is desired that the entire cell population retain data when the voltage $V_{dd}$ (Procedure (14) FIG. 3) is below the specification which has been chosen arbitrarily to be 1.0. However, several cells are depicted as not passing at 1.1, 2.0, or 2.5. These cells cannot be brought back, and do, not pass the test. The cells which fail to pass should be eliminated by using spare memory cells of the die or should be rejected.

The multi-pattern data retention test procedure outlined in FIG. 3 provides for intra-cell leakage testing, inter-cell leakage, block-to-block leakage, and slowest bit measurement. Other memory responses to the extent considered relevant can obviously be considered in the multi-pattern data retention test procedures.

Referring to FIG. 2, after a first multi-pattern data retention test (10) in accordance with FIG. 3, a high voltage screen test (20) is conducted. Here the die is subjected to a high voltage which may cause failures or breakdown or activate defects. After the high voltage is reduced back to $V_{dd}$, a second multi-pattern test is conducted at procedure (30). This second multi-pattern data test is conducted and in accordance with the procedures shown in FIG. 3. At the completion of the second multi-pattern data test, a comparison of results can then be made between the data read out in procedure (10) of FIG. 2, to the data read out in procedure (30) of FIG. 2. If the pattern remains the same, it will be known that the die has withstood both a high voltage screen and the multi-pattern data test retention procedures of FIG. 3.

In FIG. 9 there is shown a block diagram of a test procedure used for determining whether a die such as SRAM, ASIC or logic device is known to be good. Here, the testing procedures are iterative test procedures which are conducted over and over again until a stability objective is met. As shown in FIG. 9, one such iterative test can be conducted using Iddq on ASICs or logic devices. A similar iterative or changes of measurements test can be conducted on SRAMS, if the iterations are with respect to memory data retention, not Iddq.

In a logic device, data is applied to the input, processed and is then received as an output from the device. A typical Known Good Die test for a logic device is the use of minimum $V_{dd}$ testing, and Iddq testing. Minimum $V_{dd}$ testing in logic devices can test for minimum operating conditions and can be used primarily to determine cracked conductors. Cracked (metal) conductors can occur as a floating node that is coupled capacitively. If such a metal line is cracked, it is not fully electrically coupled to the circuit. This test, therefore, works on logic and memory devices. Control lines such as bit lines and word lines, do not carry significant current except during discharge and charging there may be capacitive coupling if there is a crack in the line. This allows floating to different potentials which is undesirable.

Figure 10:
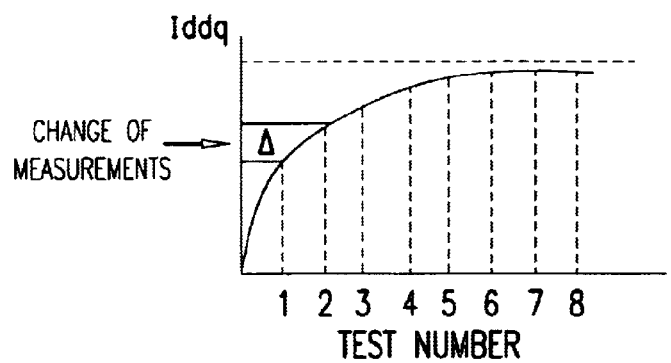
FIG. 10 shows a graph of an iterative change of measurements test procedure where Iddq is measured in an iterative test procedure in combination with a multi-pattern data retention test.

The reduced $V_{dd}$ test works by dropping down the power supply ($V_{dd}$). Eventually, there is insufficient voltage to drive the other side of the capacitor which occurs in a broken line. When this occurs, the open circuit is then detectable by the minimum $V_{dd}$ test. As shown in FIGS. 9 and 10, a typical test procedure may involve any number of tests or iterations. The number of iterations is determined by the stability objective. If the die gives a stable series of responses, there is no need to test further. If the die does not stabilize, it is determined not to be good and not classified as a Known Good Die. The testing, however, is to determine if Iddq becomes stable after a number of tests or if Iddq, for example, approaches asymptotically a maximum value of Iddq (FIG. 10). As shown in FIG. 9, procedure (40) is an initial screening test which can be for Iddq response or any other response of the die to test conditions. The next procedure (50) subjects the die to a high voltage screen to stress the die prior to conducting a further test. The die screening test at procedure (60) is a second screen test such as Iddq after the high voltage screen procedure (50), as depicted in FIG. 10.

The change of measurements referred to in procedure (60) are the difference from one measurement to the next where each measurement is under the same conditions. As shown in FIG. 10, a change of measurements is the difference in Iddq between any two sets of tests. In FIG. 10, the first change of measurements is shown as the difference between measurement 1 and measurement 2. When change of measurements becomes sufficiently small, as between measurements 7 and 8, it is also known that the Iddq has stabilized, and the high voltage stress (the die screening test) is no longer causing inconsistent Iddq measurements. An iterative changes of measurements test may also be used with any defect activating test such as a high voltage stress test or a thermal test. When there are more defects activated, the difference in measurements will disappear.

In procedure (70), the criteria for the size of change of measurements is compared to actual measurement. When change of measurements decreases to a predetermined amount or when Iddq (or another test parameter) becomes stable from measurement to measurement, the stability objective is met, and there is no longer need for high voltage screening of the die. At this point, the die can be classified as a Known Good Die. However, if a predetermined number of iterations is exceeded before stability is achieved, then the die is rejected as shown in procedure (75) of FIG. 9.

Figure 11:
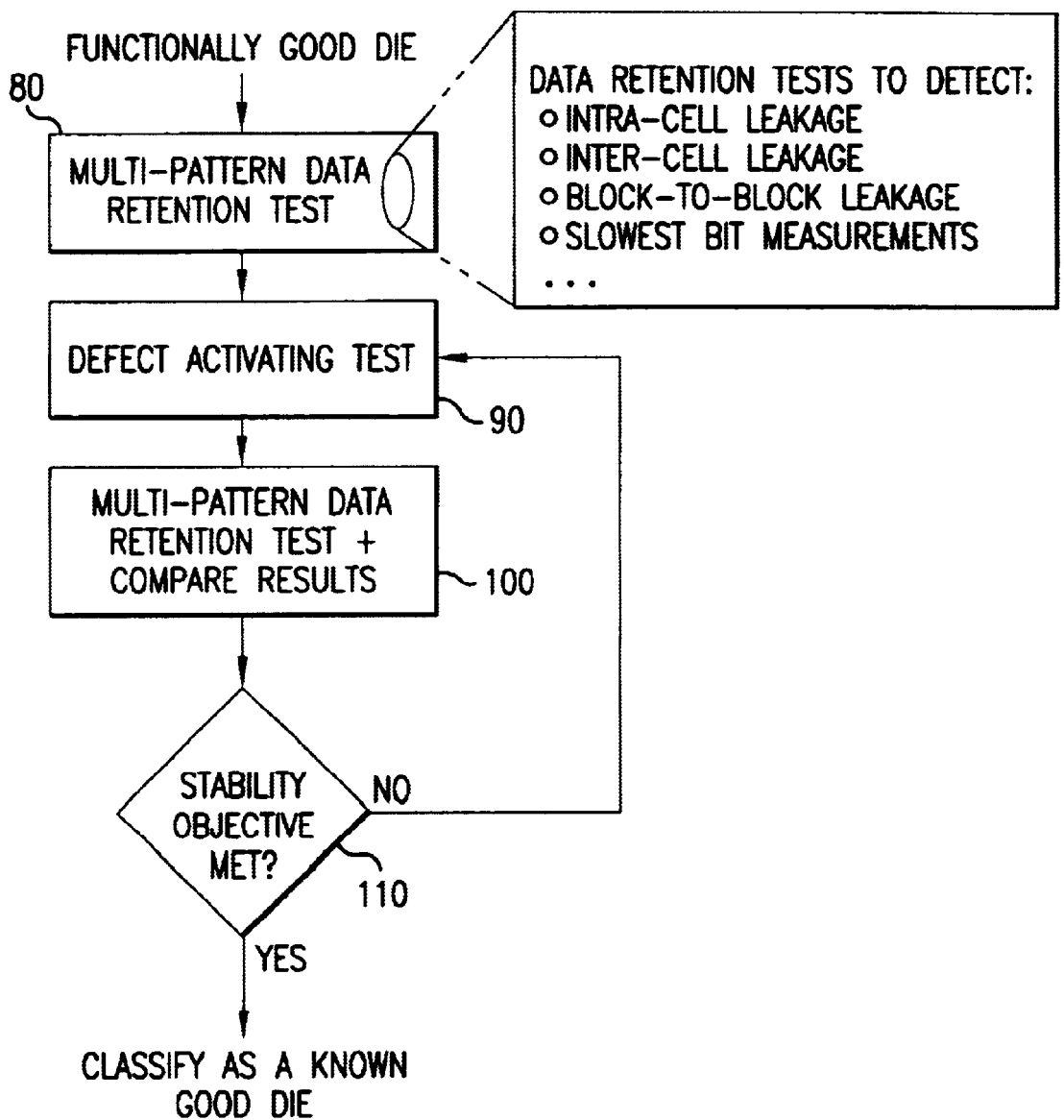
FIG. 11 shows a multi-pattern data retention test and a change in measurements test procedure.

In FIG. 11, there are shown test procedures utilizing both the change of measurements concept and the multi-data retention test procedures. The multi-data retention test of procedure (80) is that shown in FIG. 3. Next, a defect activating test which may be a high voltage screen or stress test is applied at procedure (90). The high voltage screen is a high voltage stress applied to the SRAM or other device which may cause failures such as shorting of connections, arcing, and breakdowns.

In procedure (100) a second multi-data retention test is conducted in accordance with FIG. 3 to determine if the memory is still capable of receiving and holding data after the procedure (90) high voltage screen. The multi-pattern data retention test is then compared to the results of the earlier multi-pattern data retention test in test procedure (80) or that of a previous multi-data retention test taken at procedure (100). Finally, when it is found that the patterns have stabilized and that repeated high voltage screening combined with repeated multi-pattern data testing at procedures (90) and (100) yields the same memory retention characteristic, it is said that a stability objective is met. Ideally the stability objective would be no change in memory retention by any of the memory cells which may be counted in the millions on modern memory devices.

Figure 12:
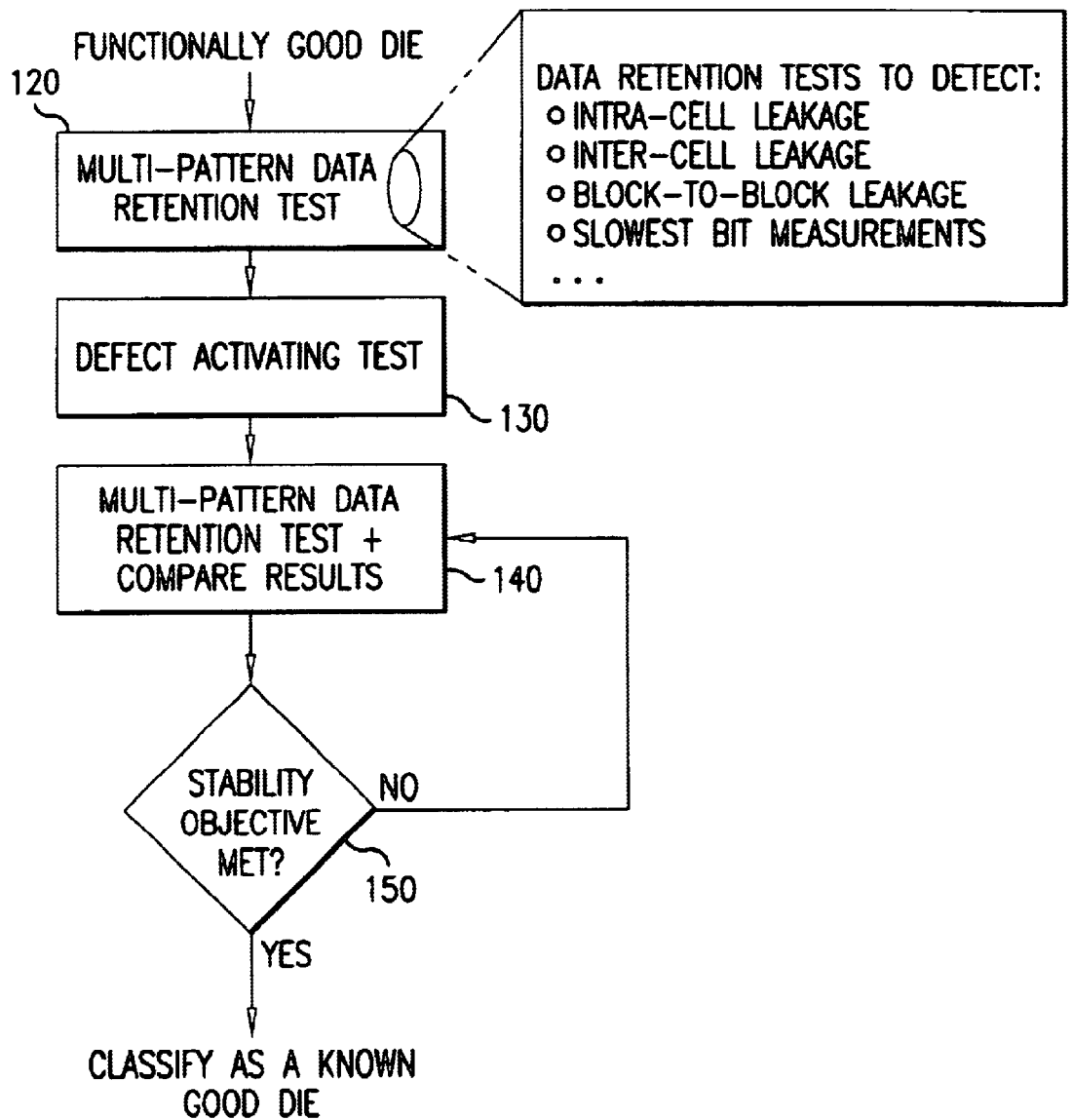
FIG. 12 shows a multi-pattern data test in combination with a multi-pattern data test procedure including change of measurements wherein the iterative-testing is of the multi-pattern data retention.

In FIG. 12 there is shown another approach to multi-pattern data testing in combination with stability objectives. Here, a single voltage screen (130) is applied after a first multi-pattern data test is used to initially screen the die. However, rather than repeatedly subjecting the die to the high voltage screen, here the multi-patterned data test is merely repeated at procedure (140) in accordance with the procedures shown in FIG. 3 until it is determined that the memory cells of the device do not change in read in and read out from test to test by comparing results, procedure (140). When the stability of objective of read in/read out is met, then the device can be classified as a Known Good Die.

Figure 13:
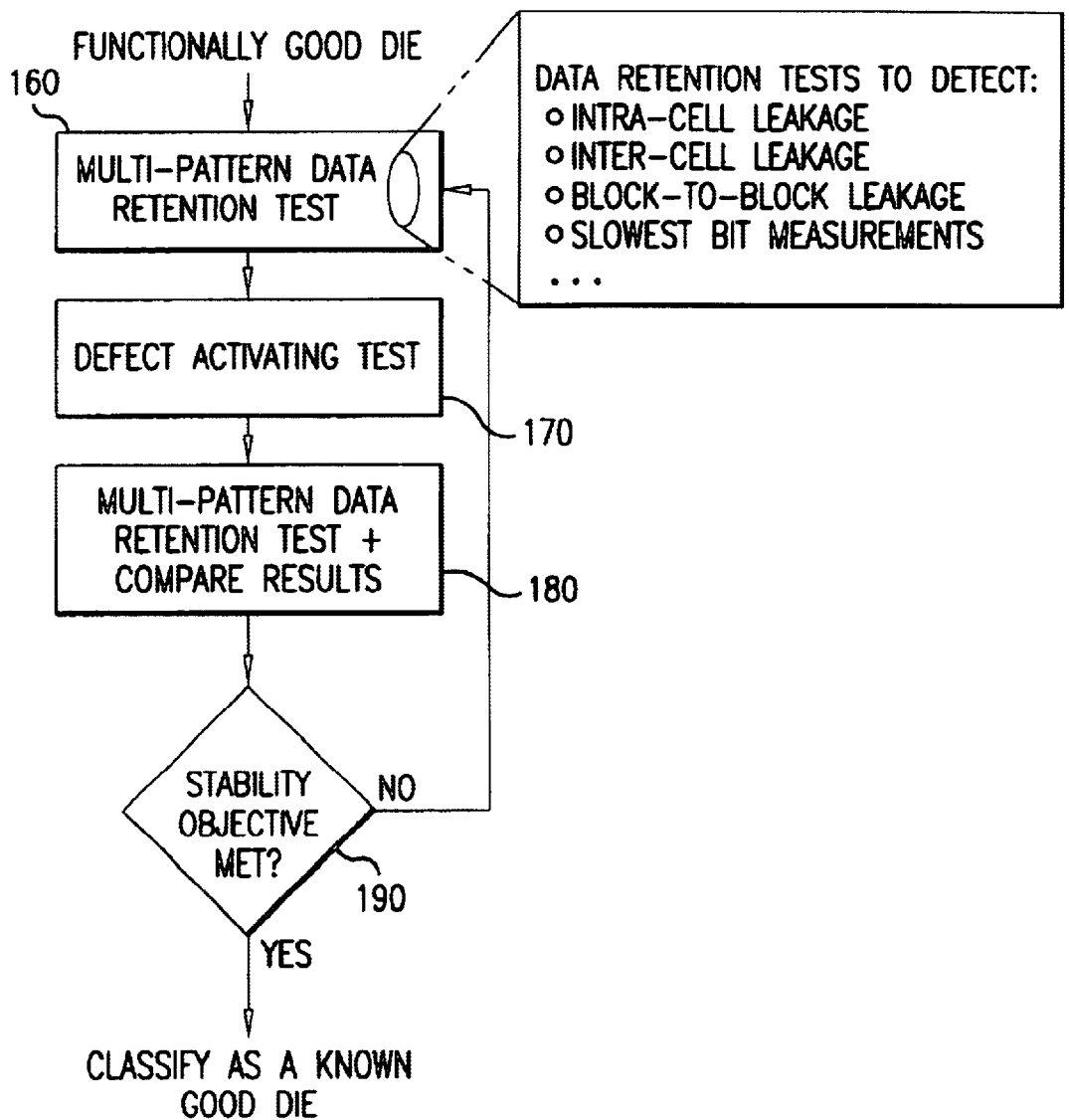
FIG. 13 shows a multi-pattern data retention test in combination with a high voltage screen, change of measurements, wherein the stability objective considers the iterative multi-pattern data retention test, the high voltage screen and a further multi-pattern data retention test.

In FIG. 13 there is shown other test procedures for testing a memory device utilizing the multi-pattern data retention test and the concept of iterative changes of measurements. Here, if the stability objective is not met, the routine returns back to procedure (160) for another multi-pattern data retention test. Next, a high voltage screen is conducted at procedure (170), and then a second multi-pattern data retention test is conducted at procedure (180). The measurements compare results procedure (180) referred to are changes in multi-pattern data retention in comparing the results of procedure (180) to (160) or any previous retention pattern. When these are determined to be sufficiently stable (or non-changing), then it is determined that the die has achieved memory retention stability and can be classified. as a Known Good Die. If the die has not achieved sufficient stability, It is again tested by returning to procedure (160). If it is not stable, it must be discarded or extra cells must be used in place of defective cells.

What is claimed is:

1. A method for screening for a Known Good Die comprising:

conducting a defect activating stress on a functionally good die;

conducting a die screening test after conducting the defect activating test;

analyzing data from said die screen test to determine changes of electrical characteristics in said functionally good die;

analyzing of changes in said electrical characteristics to determine if a stability objective is met;

classifying the functionally good die as a Known Good Die if a change of measurement stability objective has been met;

wherein when the stability objective is not met, returning to and repeating the defect activating test and repeating each subsequent procedure.

2. A method for screening for a Known Good Die in accordance with claim 1 wherein said defect activating test is a high voltage stress test.

3. A method for screening for a Known Good Die in accordance with claim 1 wherein said defect activating test is a thermal cycling test.

4. A method for screening for a Known Good Die in accordance with 1, wherein change of measurement is a comparison of multi-pattern data retention tests.

5. A method for screening for a Known Good Die comprising:

- conducting a defect activating stress on a functionally good die;
- conducting a die screening test after conducting the defect activating test;
- analyzing data from said die screen test to determine changes of electrical characteristics in said functionally good die;
- analyzing of changes in said electrical characteristics to determine if a stability objective is met;
- classifying the functionally good die as a Known Good Die if a change of measurement stability objective has been met;
- further comprising repeating the defect activating test, and analysis of changes of measurements a predetermined number of times.

6. A method for screening for a Known Good Die in accordance with claim 5, wherein said defect activating test is a high voltage stress test.

7. A method for screening for a Known Good Die in accordance with claim 5, wherein said defect activating test is a thermal cycling test.

8. A method for screening for a Known Good Die in accordance with 5, wherein change of measurement is a comparison of multi-pattern data retention tests.

9. A method for screening for a Known Good Die comprising:

- conducting a first multi-pattern data retention test;
- wherein a multi pattern data retention test comprises:
- writing a pattern at $V_{dd}$ into memory;
- lowering $V_{dd}$;
- restoring to the $V_{dd}$ at writing;
- reading the memory; and
- comparing the pattern to a pattern obtained in reading the memory and;
- determining data retention;
- subjecting the die to a defect activating test;
- conducting a second multi-pattern data retention test and comparing the results to the first multi-pattern data retention test to determine if defects have been activated; and
- determining if a stability objective has been met.

10. A method in accordance with claim 9, wherein when it is determined that the stability objective has not been met, returning to the procedure of subjecting the die to a second defect activating test.

11. A method in accordance with claim 9, wherein when it is determined that the stability objective has not been met, returning to the procedure of conducting a second multi-pattern data retention test and continuing to the determining if a stability objective has been met.

12. A method in accordance with claim 9, wherein when it is determined that the stability objective has not been met, returning to the procedure of conducting a first multi-pattern data retention test and continuing to the determining if a stability objective has been met.

* * * * *